(12) United States Patent
Kawaguchi et al.

(10) Patent No.: US 8,421,451 B2
(45) Date of Patent: Apr. 16, 2013

(54) ASSEMBLY STRUCTURE OF CURRENT DETECTION DEVICE

(75) Inventors: Yasunori Kawaguchi, Shimada (JP); Toshirou Mochizuki, Shimada (JP); Takayuki Asami, Shimada (JP)

(73) Assignee: Yazaki Corporation, Tokyo (JP)

( * ) Notice: Subject to any disclaimer, the term of this patent is extended or adjusted under 35 U.S.C. 154(b) by 262 days.

(21) Appl. No.: 13/060,303

(22) PCT Filed: Jan. 18, 2010

(86) PCT No.: PCT/JP2010/050515
§ 371 (c)(1),
(2), (4) Date: Feb. 23, 2011

(87) PCT Pub. No.: WO2010/082654
PCT Pub. Date: Jul. 22, 2010

(65) Prior Publication Data
US 2011/0148407 A1 Jun. 23, 2011

(30) Foreign Application Priority Data
Jan. 19, 2009 (JP) .................................. 2009-008809

(51) Int. Cl.
*G01R 33/02* (2006.01)

(52) U.S. Cl.
USPC .......................................................... 324/244

(58) Field of Classification Search .................. 324/244
See application file for complete search history.

(56) References Cited

U.S. PATENT DOCUMENTS

2002/0172021 A1* 11/2002 Seri et al. ...................... 361/760
2004/0175916 A1* 9/2004 Shin et al. ..................... 438/613

FOREIGN PATENT DOCUMENTS

| JP | 2001-272422 A | 10/2001 |
| JP | 2007-171156 A | 7/2007 |
| JP | 2008-198949 A | 8/2008 |

* cited by examiner

Primary Examiner — Bot Ledynh
(74) Attorney, Agent, or Firm — Sughrue Mion, PLLC

(57) ABSTRACT

An assembling structure is provided which is capable of greatly reducing the material cost, is easy-to-assemble, and can be made smaller. The sensor body is provided on a lower face with a protrusion, which comes into contact with an upper face of the busbar when the sensor body is mounted on the busbar. The busbar is provided with a through-hole passing through the busbar in a vertical direction. A leading end of the protrusion, which passes through the through-hole when the sensor body is mounted on the busbar, is heat-fused and adheres to the circumference of the through-hole.

1 Claim, 7 Drawing Sheets

FIG.2
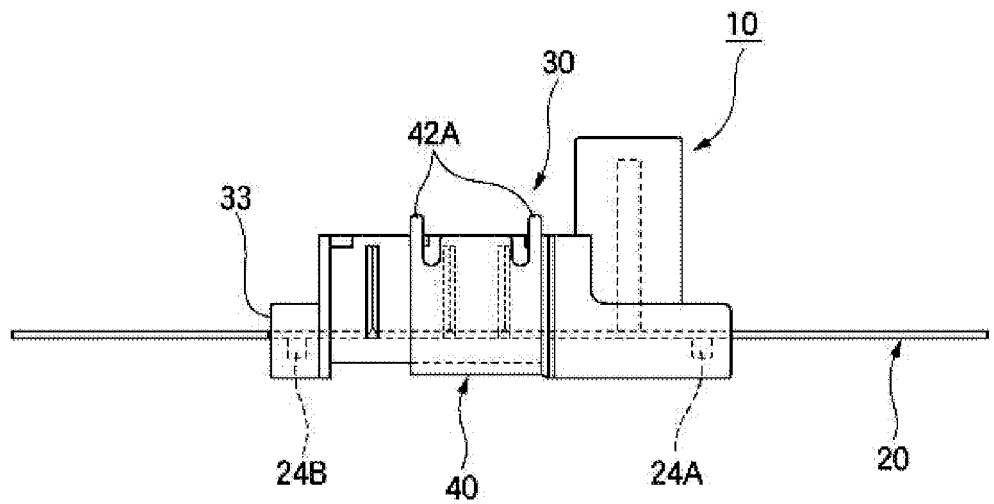
(A)
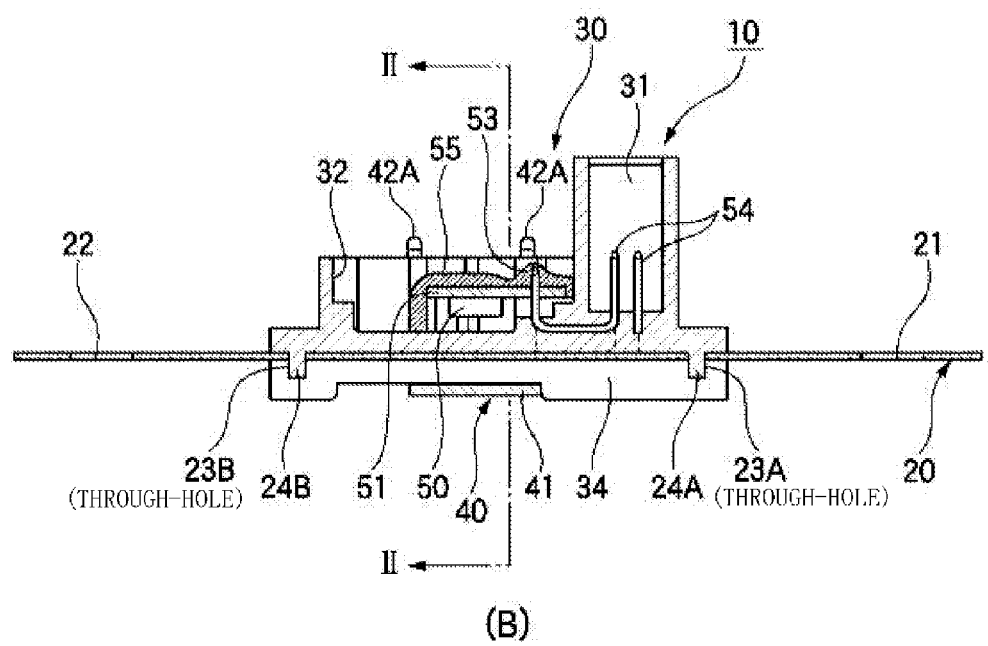
(B)

FIG.4
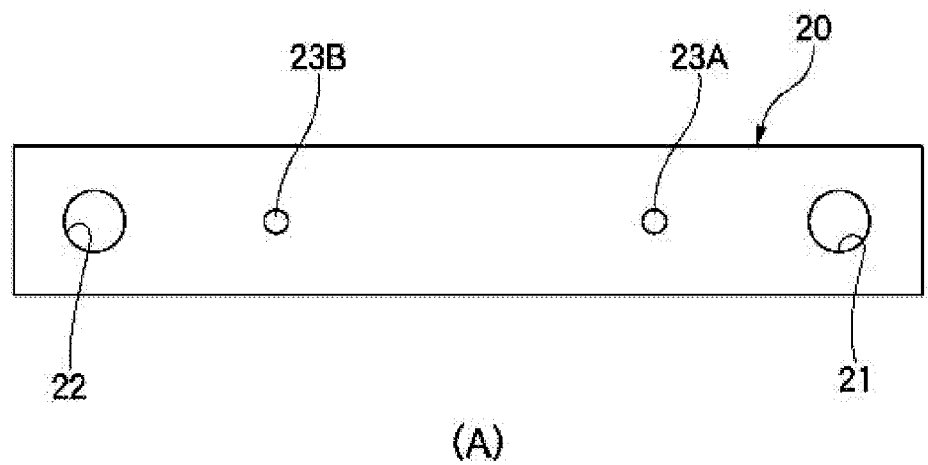
(A)
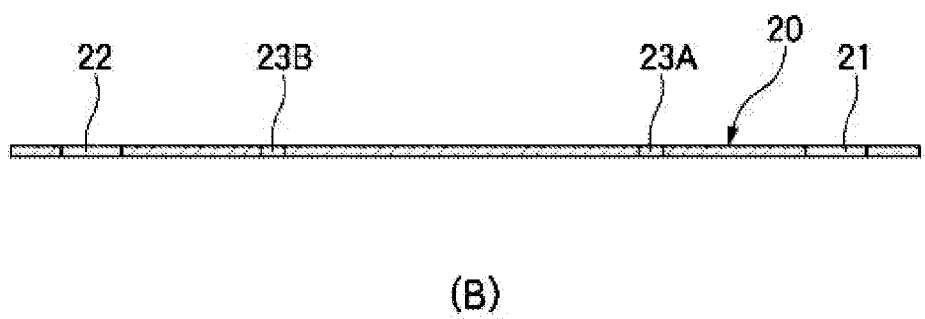
(B)

ASSEMBLY STRUCTURE OF CURRENT DETECTION DEVICE

TECHNICAL FIELD

The present invention relates to an assembly structure of a current detection device which is attachable to a busbar without deteriorating the detecting precision, is low-priced, and is capable of being mass-produced.

BACKGROUND ART

Conventionally, a current detection device has been known which detects a value of current flowing between a battery and vehicle electric equipment by detecting magnetic flux that is generated from current that flows through a harness connected to a terminal of the battery. The current detection device is attached to part of a vehicle by means of a component such as a bracket or the like. Detection of magnetic flux is carried out in a detecting hole of the current detection device after the harness is inserted into the detecting hole.

However, in the conventional current detection device, it is needed to use a separate component such as a bracket in order to attach the current detection device to a vehicle, so that the number of the parts increases and the construction becomes complicated. Further, since the harness that is flexible should be inserted into the detecting hole to perform the current detection, the detecting hole is needed to enlarge, which makes it difficult for an operator to do his detecting work. This restricts the current detection device from being made smaller.

Thus, disclosed was a current detection device for a vehicle which can be made smaller, can be easily assembled, and is of a simple construction (e.g. Patent Literature). The current detection device, as shown in FIG. 8, is configured so that an end 201 of a busbar 200 is connected to a terminal 101 of a battery 100 by means of a screw 102, and a current detector 300 is supported by the busbar 200. Further, another end 202 of the busbar 200 is connected to a terminal 401 of the harness 400 which bites an end of the harness which is connected to vehicle electric equipment.

As shown in FIG. 9, the current detector 300 includes a detector body 301 in which a core 302 is fixed thereto to surround a detecting hole 304, through which the busbar 200 passes, and a hall device 303 is mounted between opposite ends of the core 302, whereby the current detection device is simplified in construction and can be made smaller, thereby improving the assemblability furthermore.

BACKGROUND ART

Patent Literature

Patent Literature 1: JP-A-2001-272422

SUMMARY OF INVENTION

Technical Problem

However, a conventional current detection device has problems as follows:
(1) As described above, since a certain magnetic structure is needed to collect magnetic flux, a magnetic core having a hole should be provided, and a busbar passes through the hole.
(2) Since if the shape of the busbar is complex, the busbar is difficult to be inserted into the hole, the hole needs to be enlarged, which makes the magnetic core larger.
(3) If the shape of the busbar is complex, the amount of cutting scrap increases, resulting in an increase in material loss, and the manufacturing cost also rises due to an increase in the number of processes, which includes e.g. a bending process.

The present invention has been made in view of the above problems, and a purpose of the present invention is to provide an assembly structure of a current detection device which considerably reduce the material cost, is easily assembled, and is amenable to miniaturization.

Solution to Problem

In order to achieve the above object, an assembly structure of a current detection device according to the present invention includes following features.
(1) An assembly structure of a current detection device, comprises:
 a busbar;
 a sensor body comprised of a heat-fusible resin material; and
 a magnetic detection element provided on the sensor body to detect magnetism generated from the busbar,
 wherein a protrusion is provided on a lower face of the sensor body and the lower face of the sensor body comes into contact with an upper face of the busbar when the sensor body is mounted on the busbar;
 wherein the busbar has a through-hole; and
 wherein a leading end of the protrusion, which passes through the through-hole of the busbar when the sensor body is mounted on the busbar, is heat-fused and adheres to a circumference of the through-hole.

According to the assembly structure of the current detection device of the construction (1), the sensor body is composed of fusible resin material, so that when heat is applied from exterior, the sensor body can be fused at a certain heating rate. Thus, the protrusion which is integrally formed on the lower face of the sensor body is inserted into the through-hole of the busbar, that is a rectangular metal plate having no protrusion and recess on the circumference, a leading end of the protrusion, which extended below the busbar, is heat-fused to form an adhering mass larger than a diameter of the through-hole, so that the sensor body can be attached to the busbar at the adhering mass. Thus, the adhering mass allows the sensor body and the busbar to be integrally bonded together in the vicinity of the through-hole.

Also, according to the assembly structure of the current detection device of the construction (1), there are the effects of the integration of the sensor body and the busbar being realized in a simple manner, the construction being obtained cost-effectively, the current detection device being easily assembled, and the current detection device being made smaller.

Advantageous Effects of Invention

According to assembly structure of the current detection device, the busbar is configured to have a shape of a simple rectangle having no irregular portions on the circumference, contributing to reduction in material cost, and to efficient assembly of the sensor body and the busbar. Furthermore, the entire construction is simple, is easy-to-assemble, and is very amenable to miniaturization.

The present invention has been set forth briefly. Meanwhile, details of the invention will become apparent through reading the embodiments of the invention with reference to the accompanying drawings.

BRIEF DESCRIPTION OF DRAWINGS

FIG. 2(A) is a side view showing the current detection device of FIG. 1.

FIG. 2(B) is a cross-sectional view taken along line I-I of FIG. 1.

FIG. 4A is a plan view showing a busbar of the current detection device of FIG. 1.

FIG. 4B is a front view showing the busbar of the current detection device of FIG. 1.

DESCRIPTION OF EMBODIMENTS

Embodiments of the invention will now be described with reference to the accompanying drawings.

First Embodiment

Figure 1:
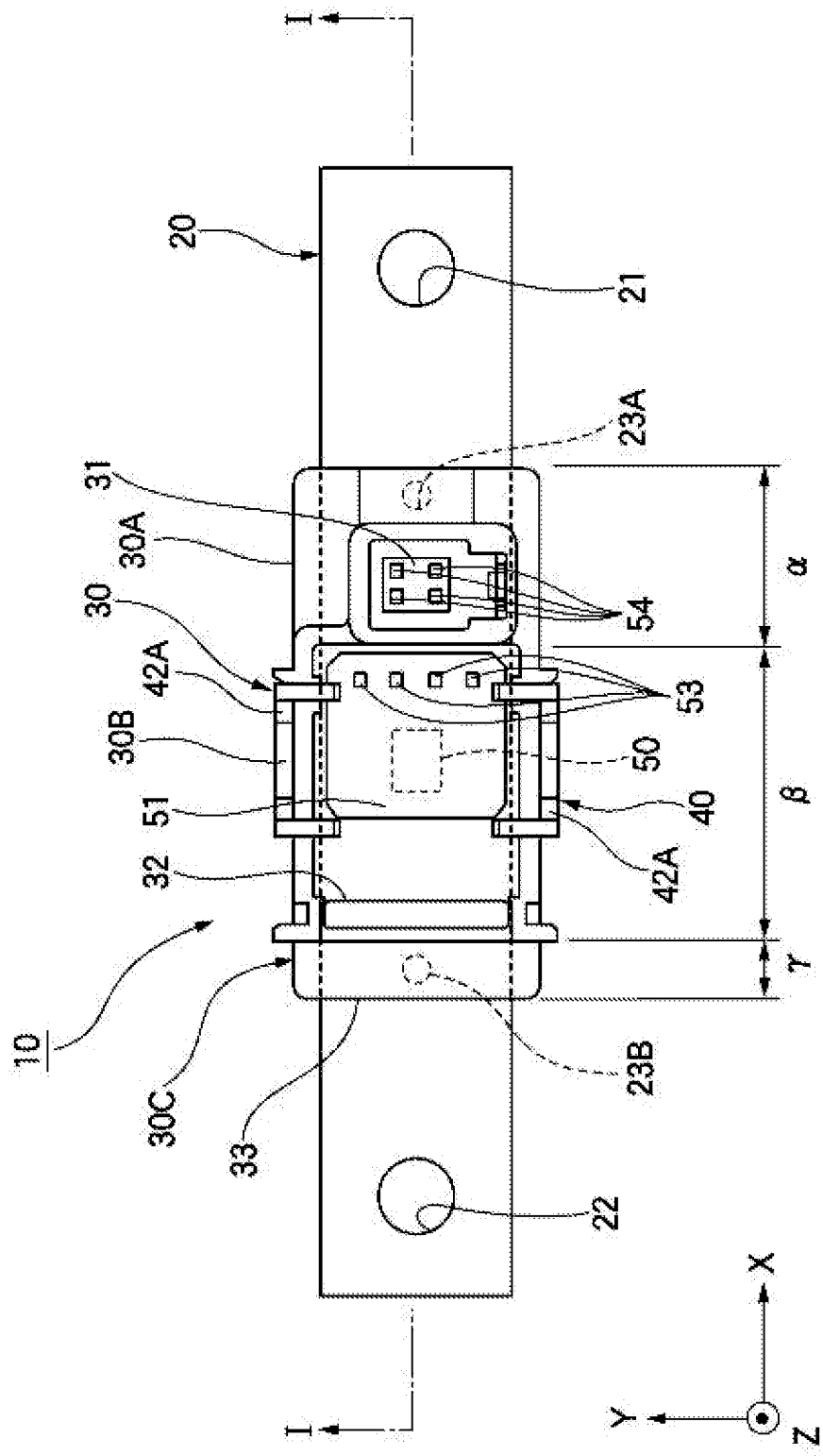
FIG. 1 is a plan view showing a configuration of a current detection device according to an embodiment of the invention.
Figure 3:
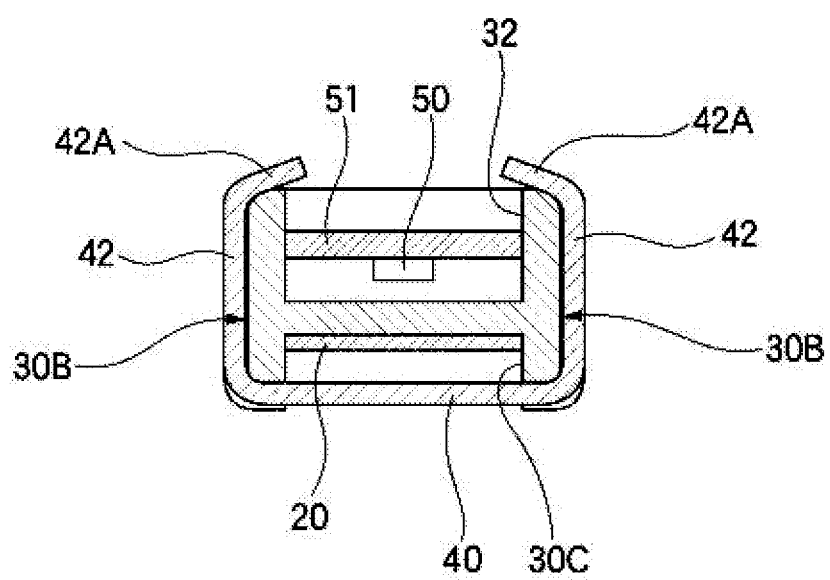
FIG. 3 is a cross-sectional view taken along line II-II of FIG. 2.
Figure 5:
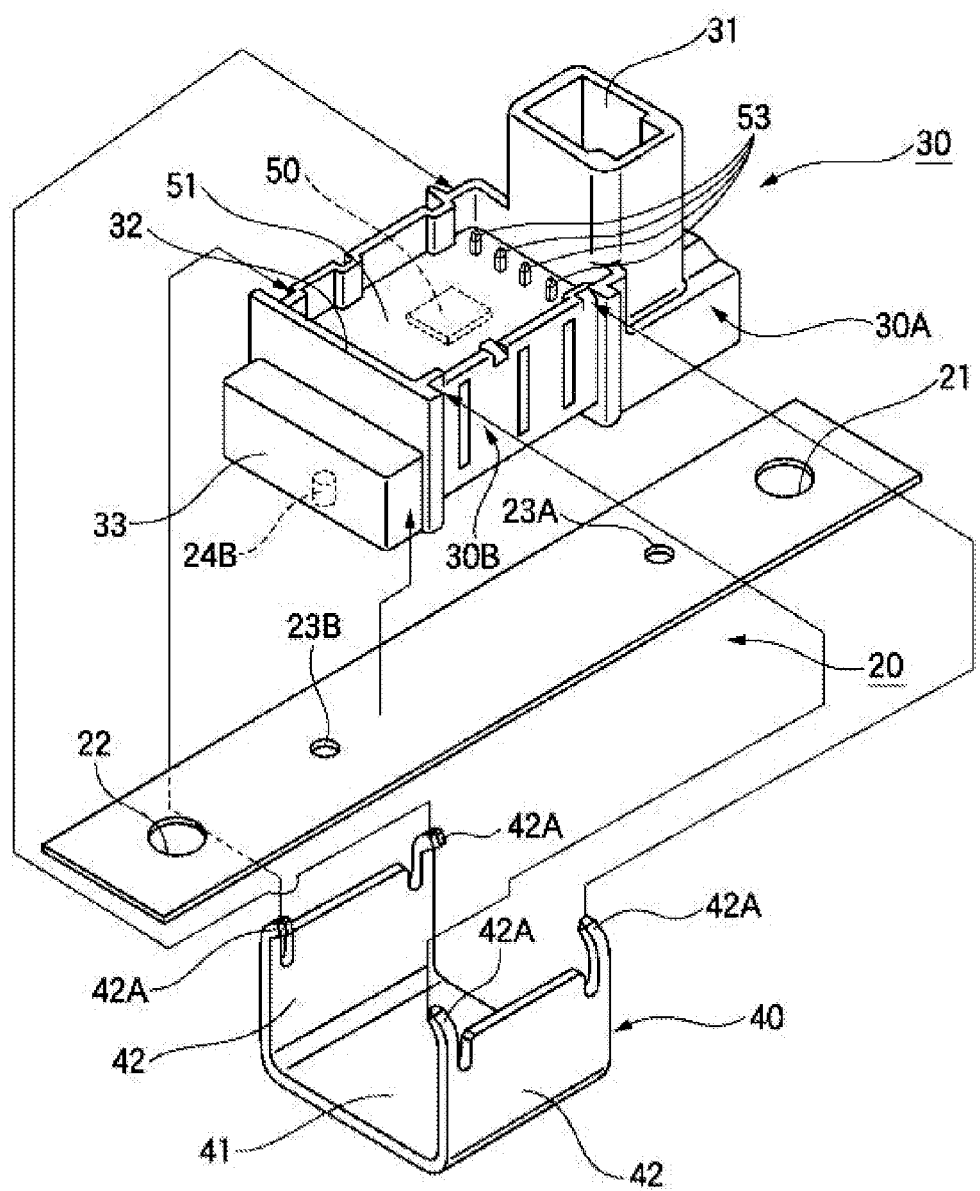
FIG. 5 is an exploded perspective view showing the current detection device of FIG. 1.
Figure 6:
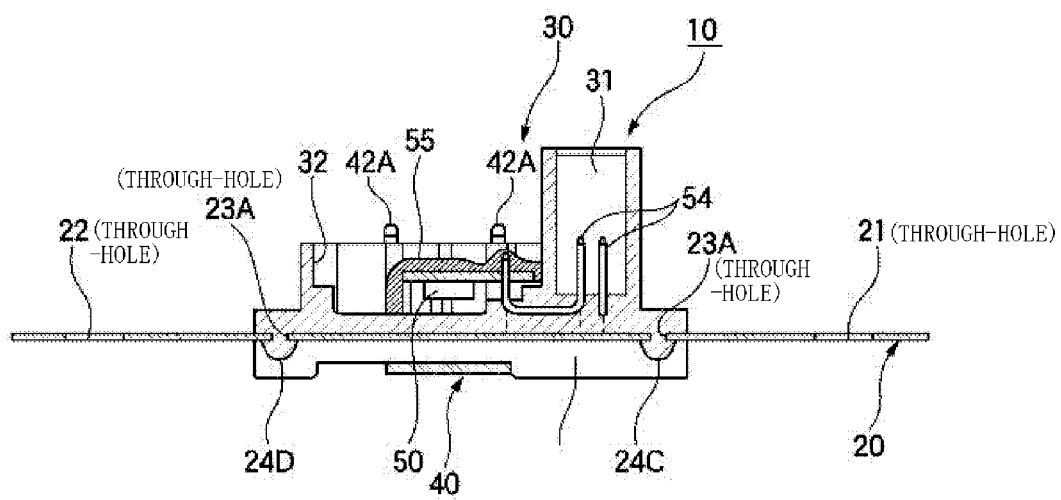
FIG. 6 is a cross-sectional view showing the state of a sensor body and the busbar being welded.
Figure 7:
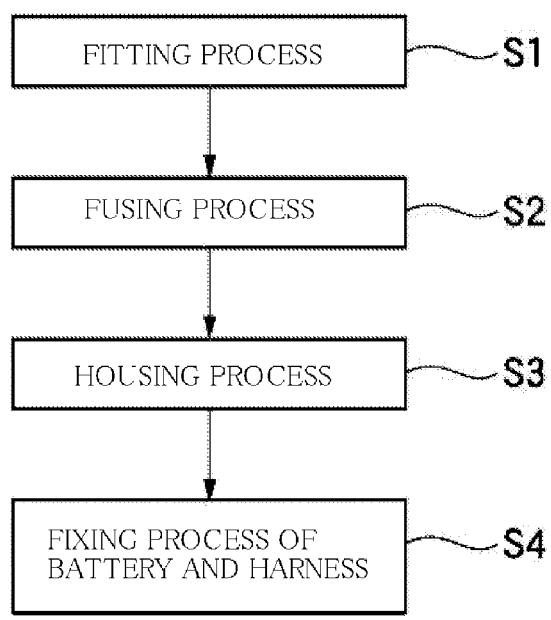
FIG. 7 is a flow chart showing a procedure of a method of assembling the current detection device according to the embodiment of the invention.
Figure 8:
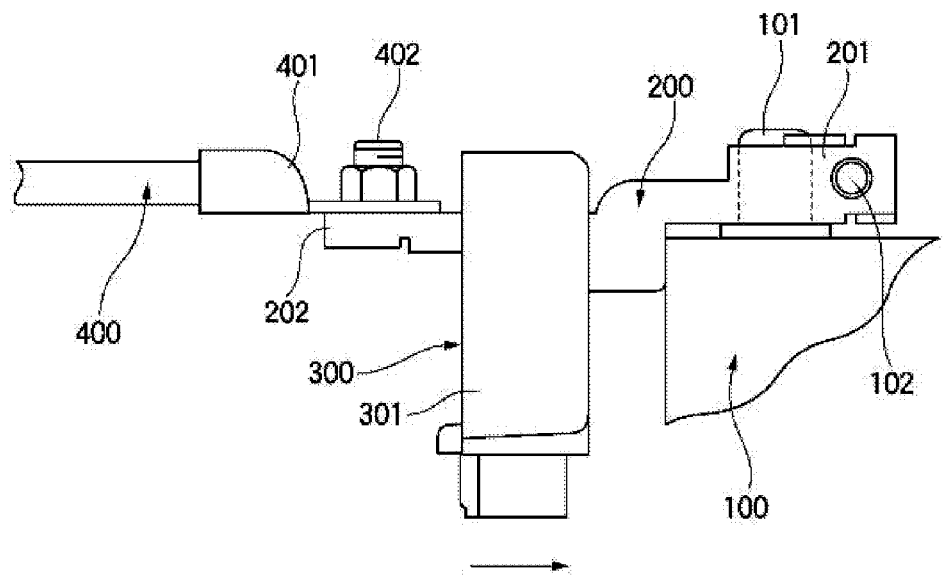
FIG. 8 is a front view showing a conventional current detection device.
Figure 9:
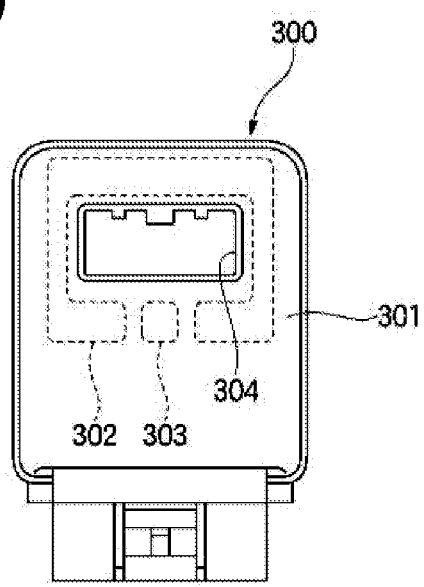
FIG. 9 is a side view of the conventional current detection device of FIG. 8.

FIG. 1 is a plan view showing a configuration of a current detection device according to an embodiment of the invention. FIG. 2(A) is a side view showing the current detection device of FIG. 1. FIG. 2(B) is a cross-sectional view taken along line I-I of FIG. 1. FIG. 3 is a cross-sectional view taken along line II-II of FIG. 2. FIG. 4A is a plan view showing a busbar of the current detection device of FIG. 1. FIG. 4B is a front view showing the busbar of the current detection device of FIG. 1. FIG. 5 is an exploded perspective view showing the current detection device of FIG. 1. FIG. 6 is a cross-sectional view showing the state of a sensor body and the busbar being welded. FIG. 7 is a flow chart showing a procedure of a method of assembling the current detection device according to the embodiment of the invention.

FIG. 1 and FIGS. 2(A) and 2(B) show the current detection device 10 which is manufactured by an assembling method according to an embodiment of the present invention. The current detection device 10 is mounted in a vehicle and includes a busbar 20, a sensor body 30 having a detecting section β, and a magnetic shield member 40.

The busbar 20 has one end (a left end in FIG. 1) which is integrally connected to an end of a harness (not shown) for connecting a vehicle electric equipment to a battery (both are not shown) and has another end (a right end in FIG. 1) which is integrally connected to a terminal of the battery. As shown in FIG. 1 and FIG. 4, the busbar 20 has screw holes 21 and 22 on opposite end sides thereof. For example, the busbar is connected with a terminal (i.e. a negative terminal for prevention of a short circuit, although not shown) of the battery by fastening a bolt or a screw through the hole 21, and the busbar is connected with an end of the harness by fastening a bolt or a screw through the hole 22.

As shown in FIG. 4, the busbar 20 is configured so that a pair of through-holes 23A and 23B are formed between the screw holes 21 and 22 such that the pair of through-holes 23A and 23B pass through the busbar 20 in a vertical direction from an upper face of the busbar 20 to a lower face of the busbar 20. Each of the through-holes 23A and 23B has a diameter smaller than that of the screw holes 21 and 22. The through-holes 23A and 23B have the size and shape (generally a ring type) so as to receive a protrusion of the sensor body. Further, the surrounding area or an inner circumferential face of the through-hole may be roughened. This roughened face may contribute to an increase in the degree of adherence of the protrusion of a fusible resin with respect to the through-holes 23A and 23B.

The sensor body 30 of the embodiment is configured by non-magnetic, fusible synthetic resin material, and includes a connecting section α, a detecting section β, and a positioning section γ in order as named from an end portion (i.e. right side in FIG. 1) on the side of the battery. The respective opposite side faces of the three sections will be called as first side faces 30A, second side faces 30B, and third side faces 30C, respectively.

The connecting section α, is a section for connecting a connector (not shown) connected to a signal line (not shown). In this embodiment, a female-type connector of the connecting section α is formed as a chamber (hereinafter, referred to as a 'connector chamber') which is surrounded by four standing walls in four-direction. Meanwhile, the signal line serves to transmit, to a control IC unit or the like (not shown), an electric signal which is induced in response to the strength of magnetic field detected by a magnetic detection element 50 of the detecting section β to be described later. However, the signal line is not an essential element of the present invention. That is, the signal line is a means for transmitting a sensor output from the magnetic detection element 50 to an external circuit element (e.g. the control IC unit in this embodiment). Other elements for transmitting the sensor output, for example, to the outside via direct wired connection using a lead wire, or wireless connection may be configured.

In the detecting section β, a substrate 51 is mounted in a magnetic chamber 32 which is surrounded by four circumferential walls, and the magnetic detection element 50 is mounted on the substrate 51. The magnetic detection element 50 detects the strength of magnetic field that is generated by current I flowing through the busbar 20. For example, in this embodiment, a hall device using a hall effect is used as the magnetic detection element 50. The hall device converts the strength of magnetic field into an electric signal and output the electric signal (the magnetic field is variably induced by the varying intensity of current I flowing through the busbar 20). Thus, for example, an output voltage proportional to the magnetic flux density is output via respective terminals (hereinafter referred to as 'input terminals') 53. Voltage (electric signal) input to the input terminal 53 is output via respective terminals (hereinafter referred to as 'output terminals') 54 which are provided on the connector chamber 31 of the connecting section α. The output terminals 54 constitute terminals of the above-mentioned female connector.

The substrate 51, on which the magnetic detection element 50 is mounted, is entirely covered airtightly and waterproofly with an insulating cover 55 composed of e.g. synthetic resin, together with a leading end of the input terminal 53. The leading end of the input terminal 53 protrudes from the upper portion of the substrate 51. Thus, an electric circuit including the magnetic detection element 50 can be prevented from becoming moist or being damaged by interference with external parts or the like.

The positioning section γ positions the current detection device 10 in a vehicle. The positioning section γ is not particularly an essential component in the present invention. In this embodiment, the current detection device is precisely positioned and fixed to a certain part of a vehicle by engaging an engaging edge 33 with a positioning protrusion (not shown) or the like.

Meanwhile, a pair of protrusions 24A and 24B extending downwards are provided on a lower face of the sensor body 30. The protrusions 24A and 24B are respectively provided on positions corresponding to the connecting section α and the positioning section γ, particularly the through-holes 23A and 23B of the busbar 20. The protrusions 24A and 24B have the size and length so that the protrusions 24A and 24B can be inserted in the through-holes 23A and 23B. The size of the protrusions 24A and 24B is slightly smaller than that of the through-holes 23A and 23B, and the length thereof is greatly larger than the thickness of the busbar 20, e.g. two to three times the thickness of the busbar.

Thus, when assembling the busbar 20 to the sensor body 30, the protrusions 24A and 24B of the sensor body can be inserted into the through-holes 23A and 23B of the busbar 20, as shown in FIGS. 2(A) and 2(B).

The magnetic shield member 40 is made from a proper magnetic material, e.g. in this embodiment, magnetic strips having spring property. The magnetic shield member 40 is attached to the sensor body 30 so that the magnetic shield member 40 surrounds the detecting section β of the sensor body 30 and the busbar 20, thereby magnetically isolating them. In this embodiment, the magnetic shield member 40 includes a lower face 41 and a pair of sidewalls 42, which is formed in a lateral direction (a lengthwise direction) of the busbar 20, in order to fixedly surround the detecting section β of the sensor body 30 from the lower side (outside) of the busbar 20 as shown in FIG. 3. Further, the magnetic shield member 40 has standing claws 42A, which extend above the upper portion of the second side 30B, at four corners of the sidewalls 42. The standing claws 42A come into contact with the upper portion from the upper portion of the second side 30B.

The standing claws 42A are pre-bent at a certain angle. In this state, when the sensor body 30 is housed in magnetic shield member 40, the distance between the sidewalls 42 is enlarged by the spring property of the magnetic shield member 40 so that the standing claws 42A is directed upwards the second side 30B of the sensor body 30 while passing through the second side 30B of the sensor body 30, thereby coming into contact with it from the upper portion of the second side 30B. Meanwhile, the standing claws 42A may be bent by an assembling operator after the sensor body 30 is housed in the magnetic shield member 40.

The magnetic detection element 50 detects magnetic flux which is generated around the current I flowing through the busbar 20 as shown in FIG. 1. Because of this, the magnetic detection element 50 is arranged in a planar direction (i.e. X-Y plane) that detects the magnetic flux of current I flowing through the busbar 20, and does not detect magnetic flux in a Z-direction that is perpendicular to the X-Y plane of the busbar 20. That is, the Z-direction perpendicular to the X-Y plane of the busbar 20 is a direction along which the magnetic detection element (a hall device) 50 does not detect the magnetic flux. Thus, although the magnetic detection element 50 has an opened portion at its upper portion, such configuration has no adverse effect upon precise detection of magnetism.

Thus, according to the current detection device 10 for a vehicle of the embodiment, since the magnetic shield member 40 is provided, an external electromagnetic bad influence can be suppressed and the precise current detection can be achieved.

For example, according to a vehicle system employing the current detection device 10 of the embodiment, in some cases, magnetic field is often generated around a hall device used as the magnetic detection element 50, or a relay or a motor is often mounted around the magnetic detection element 50. In this case, because of the generated magnetic field, precise detection of magnetism may not be carried out. Further, because of an effect of environment during traveling of a vehicle, an effect of earth magnetism, high voltage power line, or the like should also be considered. However, according to the current detection device 10 of the embodiment, since the magnetic shield member 40 is provided, the magnetic shield member 40 effectively prevents the sensor output from greatly varying due to the above effects to be considered.

A description will now be made to a method of assembling the current detection device 10 of the embodiment.

The assembling method of the current detection device 10 includes a fitting process S1, a fusing process S2, a housing process S3, and a fixing process S4 of a battery and a harness. Meanwhile, in the assembling method of the current detection device, the fixing process of the battery and the harness may be first implemented so that the busbar 20 is bolt-fastened at opposite end sides thereof to the battery and the harness.

In fitting process S1, the busbar 20 is fitted into a bar-type recess 34 (see FIG. 2(B) and FIG. 5) which is formed at the center portion on the lower face of the sensor body 30. The bar-type recess 34 is formed with the same plane in the whole lengthwise portion thereof extending between opposite ends. Here, the pair of protrusions 24A and 24B that protrude from the lower face of the sensor body 30 are inserted into the through-holes 23A and 23B of the busbar 20 respectively (see FIG. 2(B)).

In fusing process S2, the portions (called leading ends) of the protrusions 24A and 24B, which have been inserted into the through-hole 23A and 23B of the busbar 20 and extended below the lower face of the busbar 20 in the fitting process S1, are heat-fused intensively by heating device using laser. When the protrusions 24A and 24B are fused, the fused portions are deformed such that the protrusions 24A and 24B are pressed against circumferences of the through-holes 23A and 23B of the busbar 20 so as to form an adhering mass. After that, heating is stopped, and then air cooling is implemented. Thus, the leading ends of the protrusions 24A and 24B become the adhering masses 24C and 24D, which are larger than inner diameters of the through-holes 23A and 23B on the lower side of the busbar 20 and adhere to the circumferences of the through-holes 23A and 23B. Therefore, the busbar 20 becomes bonded integrally and firmly to the lower face of the sensor body 30.

Unlike the conventional technology, such bonding between the sensor body 30 and the busbar 20 by fusing the protrusions 24A and 24B can be performed automatically and rapidly without preparing a separate adhering member. Further, since there is no need to make a claw on the busbar by cutting material, material scraps can be reduced. Furthermore, positioning of the protrusions 23A and 24B relative to the through-holes 23A and 23B is easily and precisely controlled, so that shaking between two elements is prevented from occurring.

In housing process S3, the sensor body 30 is housed in the magnetic shield member 40 such that the detecting section β of the sensor body 30 and the busbar 20 are surrounded by the magnetic shield member 40. Thus, the busbar 20 and the magnetic shield member 40 are integrally fixed to the sensor body 30.

In fixing process S4 of a battery and a harness, an end of the busbar 20, to which the sensor body 30 and the magnetic shield member 40 are integrally fixed, is connected to a terminal (particularly a negative terminal) of a battery via a bolt or the like, and another end of the busbar 20 is screw-coupled to an end of a harness.

Subsequently, a connector, which is connected to a signal line for transmitting a quantity of current detected by the magnetic detection element 50 to a control IC unit (not shown), is connected to the female connector that is configured by the connector chamber 31 provided in the connecting section a of the sensor body 30.

Thus, according to the assembly structure and method of assembling the current detection device 10 for a vehicle of the embodiment, although the busbar 20 has already been mounted onto other component, it is easy to attach the sensor body 30 and the magnetic shield member 40 to the busbar.

Further, if the busbar has a simple shape (e.g. a rectangle) as in the embodiment, the sensor body 30 and the busbar 20 may be integrally fixed to each other using an insert molding method. Further, according to the assembly method of the current detection device 10, the sensor body 30 and the busbar 20 may be separately molded, so that the current detection device that can be made in a mass-production manner to have a small size is realized.

The current detection device of the invention is not limited to the part of a vehicle system as described in the embodiment, but may be adapted to a diversity of current detection device in many fields so long as it includes a busbar.

While the present invention has been described in detail with reference to specific embodiments, it is apparent to the person skilled in the art that a variety of modifications and changes may be performed without departing from the spirit and scope of the present invention.

This application claims the benefit of Japanese Patent Application (No. 2009-008809) filed on Jan. 19, 2009, the subject matter of which is incorporated herein by reference.

REFERENCE SIGNS LIST

10 Current detecting apparatus
20 Busbar
21, 22 Screw hole
23A, 23B Through-hole
24A, 24B Protrusion
30 Sensor body
30A First side face
30B Second side face
30C Third side face
31 Connector chamber (Female connector)
34 Bar-type recess
40 Magnetic shield member
41 Lower face
42 Sidewall
50 Magnetic detection element (Hall device)
51 Substrate
53 Input terminal
54 Output terminal
α Connecting section
β Detecting section
γ Positioning section

The invention claimed is:

1. An assembly structure of a current detection device, comprising:
   a busbar;
   a sensor body formed by a heat-fusible resin material; and
   a magnetic detection element provided on the sensor body to detect magnetism generated from the busbar,
   wherein a protrusion is provided on a lower face of the sensor body and the lower face of the sensor body comes into contact with an upper face of the busbar when the sensor body is mounted on the busbar;
   wherein the busbar is provided with a through-hole passing through the busbar in a vertical direction; and
   wherein a leading end of the protrusion, which passes through the through-hole of the busbar when the sensor body is mounted on the busbar, is heat-fused and adheres to a circumference of the through-hole.

* * * * *